US012063449B2

(12) United States Patent
Kobayashi et al.

(10) Patent No.: US 12,063,449 B2
(45) Date of Patent: Aug. 13, 2024

(54) DEVICE, SYSTEM, MOVING BODY, AND SUBSTRATE

(71) Applicant: CANON KABUSHIKI KAISHA, Tokyo (JP)

(72) Inventors: Hideo Kobayashi, Tokyo (JP); Takanori Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 76 days.

(21) Appl. No.: 17/554,767

(22) Filed: Dec. 17, 2021

(65) Prior Publication Data

US 2022/0210361 A1 Jun. 30, 2022

(30) Foreign Application Priority Data

Dec. 24, 2020 (JP) ................. 2020-215240

(51) Int. Cl.
*H04N 25/79* (2023.01)
*H01L 27/146* (2006.01)
*H04N 23/10* (2023.01)
*H04N 25/75* (2023.01)

(52) U.S. Cl.
CPC ....... *H04N 25/79* (2023.01); *H01L 27/14621* (2013.01); *H04N 23/10* (2023.01); *H04N 25/75* (2023.01)

(58) Field of Classification Search
CPC ........ H04N 25/79; H04N 23/10; H04N 25/75; H04N 25/70; H01L 27/14621
See application file for complete search history.

(56) References Cited

U.S. PATENT DOCUMENTS

| 2006/0146155 A1* | 7/2006 | Shimizu | H04N 25/76 |
| | | | 348/E3.018 |
| 2018/0205886 A1* | 7/2018 | Lee | H04N 25/42 |
| 2019/0165014 A1 | 5/2019 | Wada | |
| 2021/0306588 A1* | 9/2021 | Ueyama | H04N 25/772 |

FOREIGN PATENT DOCUMENTS

| EP | 1 152 471 A2 | 11/2001 |
| EP | 3 018 894 A1 | 5/2016 |
| JP | 2016092791 A | 5/2016 |
| JP | 2020-202480 A | 12/2020 |

* cited by examiner

*Primary Examiner* — Michael E Teitelbaum
(74) *Attorney, Agent, or Firm* — Canon U.S.A., Inc. IP Division

(57) ABSTRACT

A device includes a pixel array including a plurality of pixels, a first pixel and a second pixel of the plurality of pixels corresponding to different colors, the first pixel and a third pixel of the plurality of pixels corresponding to a same color, a first circuit group connected to the first pixel, a third circuit group connected to the third pixel, and a first circuit included in the first circuit group, a second circuit, and a third circuit included in the third circuit group and having a function same as a function of the first circuit, the third circuit being arranged between the first circuit and the second circuit in a top view.

34 Claims, 12 Drawing Sheets

DEVICE, SYSTEM, MOVING BODY, AND SUBSTRATE

BACKGROUND

Field of the Disclosure

The aspect of the embodiments relates to a device, and a system, a moving body, and a substrate each including the device.

Description of the Related Art

Japanese Patent Application Laid-Open No. 2016-92791 discusses a solid-state image capturing device in which one signal line is provided for each of pixel columns, signals of the signal lines of odd columns are read out by column circuits disposed below a pixel array, and signals of the signal lines of even columns are read out by column circuits disposed above the pixel array.

In the solid-state image capturing device discussed in Japanese Patent Application Laid-Open No. 2016-92791, image quality deterioration is caused by characteristic difference among pixel columns/characteristic difference among pixel rows caused by process variation of elements, temperature distribution in a chip, power supply resistors, etc., color mixture, power supply variation, and interference of digital signal transmission with analog circuits.

SUMMARY

According to an aspect of the embodiments, a device includes a pixel array including a plurality of pixels corresponding to a same color, the plurality of pixels including a first signal line, a second signal line, a third signal line, and a fourth signal line, the first signal line being connected to a first circuit group, the second signal line being connected to a second circuit group, the third signal line being connected to a third circuit group, the fourth signal line being connected to a fourth circuit group, and a first circuit included in the first circuit group, a second circuit included in the second circuit group and having a function same as a function of the first circuit, a third circuit included in the third circuit group and having a function same as the function of the first circuit, and a fourth circuit included in the fourth circuit group and having a function same as the function of the first circuit, the first circuit, the second circuit, the third circuit, and the fourth circuit being arranged in a plurality of rows and a plurality of columns.

According to another aspect of the embodiments, a device includes a pixel array including a plurality of pixels, a first pixel and a second pixel of the plurality of pixels being arranged side by side in a first direction and corresponding to different colors, the first pixel and the second pixel being connected to different signal lines; a first circuit group connected to the first pixel, a second circuit group connected to the second pixel, and a first circuit included in the first circuit group, a second circuit, and a third circuit included in the second circuit group and having a function same as a function of the first circuit, the second circuit being arranged between the first circuit and the third circuit in a top view.

According to still another aspect of the embodiments, a device includes a pixel array including a plurality of pixels; a first circuit group connected to a first pixel, and a second circuit group connected to a second pixel, wherein the first circuit group and the second circuit group each include a comparator, a first memory holding a signal corresponding to an output of the comparator, and a second memory taking in an output of the first memory, and wherein at least a part of the second circuit group is arranged between the first memory and the second memory of the first circuit group.

Further features of the disclosure will become apparent from the following description of exemplary embodiments with reference to the attached drawings.

DESCRIPTION OF THE EMBODIMENTS

Some exemplary embodiments are described below with reference to drawings.

In each of the exemplary embodiments described below, an image capturing device is mainly described as an example of a photoelectric conversion device. However, the exemplary embodiments are applicable to other examples of the photoelectric conversion apparatus without being limited to the image capturing device. Examples of the other devices include a ranging device (device for distance measurement using focal point detection or time of flight (TOF)), and a photometry device (device for measurement of incident light quantity).

A first exemplary embodiment will be described. FIG. 1 to FIG. 4 are schematic diagrams of a photoelectric conversion device according to the first exemplary embodiment.

Figure 1:
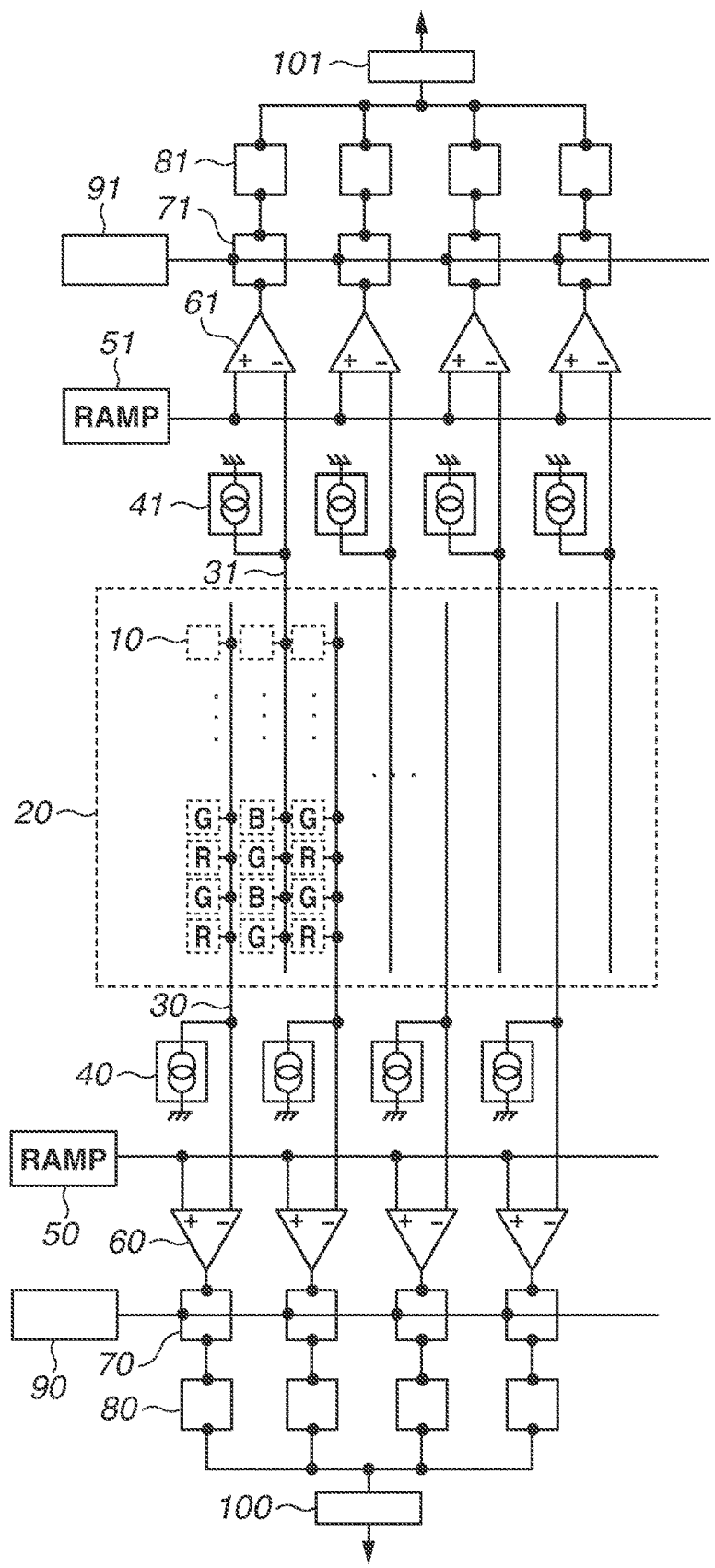
FIG. 1 is a schematic diagram of a photoelectric conversion device according to a first exemplary embodiment.

The photoelectric conversion device illustrated in FIG. 1 includes pixels 10, a pixel array 20, signal lines 30, signal lines 31, current sources 40, current sources 41, a ramp signal generation circuit 50, a ramp signal generation circuit 51, comparators 60, and comparators 61. The photoelectric conversion device further includes first memories 70, first memories 71, second memories 80, second memories 81, a counter 90, a counter 91, an output circuit 100, and an output circuit 101.

In the pixel array 20, the plurality of pixels 10 are arranged over a plurality of rows and a plurality of columns in an array. The pixels 10 include red pixels R, green pixels G, and blue pixels B. Each of the pixels includes, for example, a color filter corresponding to a wavelength band of visible light of one specific color among red, green, and blue on a light incident side thereof, thereby being associated with any of the colors. In other words, the pixels corresponding to the same color are overlapped in peak wavelength of the color filter. Here, color separation by the color filters is described as an example; however, a color separation method is not limited to the color filters.

The signal lines extending in a column direction (vertical direction in FIG. 1) are arranged in the respective columns of the pixel array 20. Each of the signal lines is connected to the pixels 10 arranged in the column direction, and serves as a signal line common to these pixels 10.

The number of pixels 10 included in the pixel array 20 is not particularly limited. For example, the pixel array 20 may include the pixels 10 arranged in thousands of rows by thousands of columns like a common digital camera, or may include the plurality of pixels 10 arranged in one row.

Pixel signals read out from the respective pixels 10 are input to a signal processing circuit through the signal lines 30 or the signal lines 31. The signal processing circuit is a circuit group including comparators 60 and 61 and memories 70, 71, 80, and 81. The comparators 60 and 61 each compare the pixel signals read out from the pixels 10 with a reference signal output from the ramp signal generation circuit. The memories 70, 71, 80, and 81 hold signals. The pixel signals are sequentially output for each column via the signal processing circuit.

(Configuration of Pixel)

A configuration of each of the pixels 10 according to the present exemplary embodiment is described.

Figure 2:
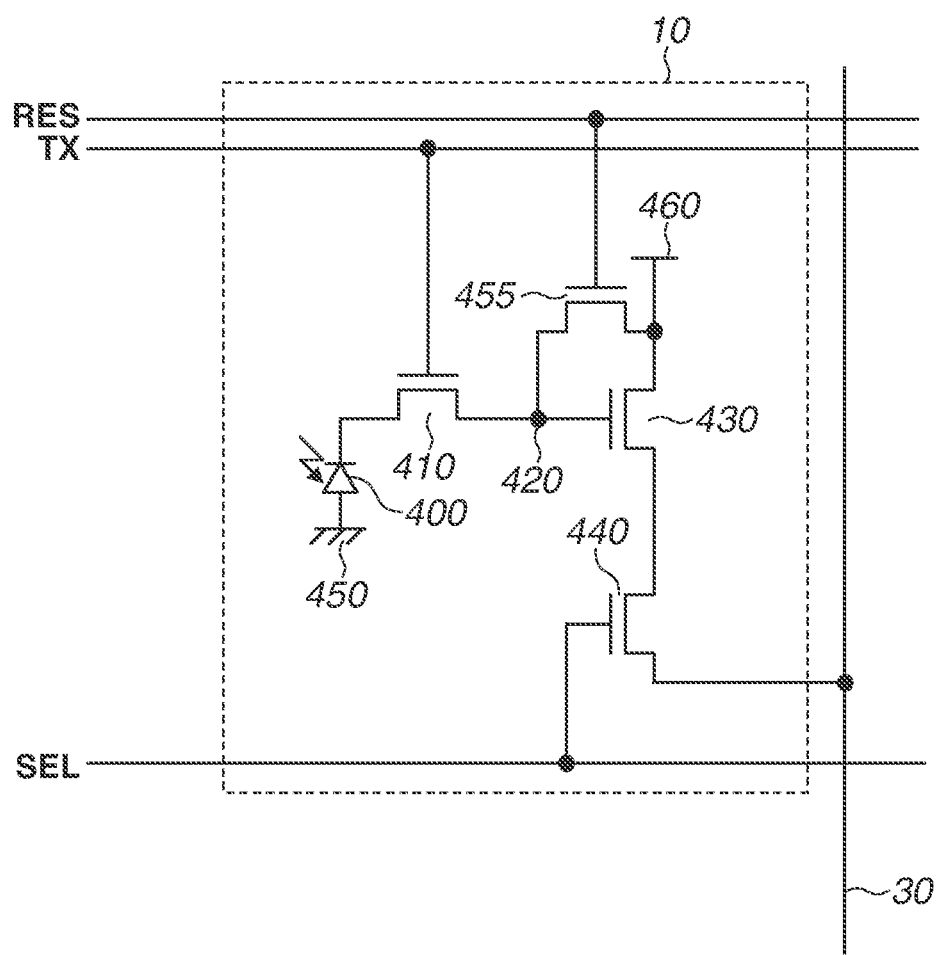
FIG. 2 is a schematic diagram of the photoelectric conversion device according to the first exemplary embodiment.

FIG. 2 illustrates an example of an equivalent circuit of each of the pixels 10.

Each of the pixels 10 includes a photodiode 400, a transfer transistor 410, a floating diffusion 420, and a source follower transistor 430. Each of the pixels 10 further includes a selection transistor 440, a ground (GND) node 450, a reset transistor 455, and a power supply node 460.

The GND node is connected to the ground having a ground potential. In the following, the ground is also referred to as GND.

The photodiode 400 is grounded at the GND node 450. The photodiode 400 is connected to the transfer transistor 410. A gate of the transfer transistor 410 receives a control signal from a corresponding control signal line Tx. The transfer transistor 410 includes a node common to the reset transistor 455 and a gate of the source follower transistor 430, and the common node serves as the floating diffusion 420. The reset transistor 455 and the source follower transistor 430 are both connected to the power supply node 460. A gate of the reset transistor 455 receives a reset signal from a corresponding reset signal line RES. The source follower transistor 430 is connected to the selection transistor 440, and a gate of the selection transistor 440 receives a selection signal from a corresponding selection signal line SEL. The selection transistor 440 is connected to the corresponding signal line 30.

(Function of Element)

A function of each of the elements of the photoelectric conversion device according to the present exemplary embodiment will be described.

The photodiode 400 photoelectrically converts incident light to generate charges.

The charges photoelectrically converted by the photodiode 400 are transferred to the floating diffusion 420 via the transfer transistor 410, and are converted into a signal voltage by a capacitor attached to the floating diffusion 420. The signal voltage is input to the gate of the source follower transistor 430, and is output to the corresponding signal line 30 via the selection transistor 440.

The source follower transistor 430 forms a source follower with the corresponding current source 40 in FIG. 1, and the signal voltage on the floating diffusion 420 is buffered by the source follower and is output to the corresponding signal line 30.

Each comparator 60 compares the signals of the corresponding signal line 30 with a ramp signal output from the ramp signal generation circuit 50. At a timing when an output of the comparator 60 is inverted, the corresponding first memory 70 takes in a count signal from the counter 90. As a result, the signals based on the charges generated by the pixels 10 is converted from an analog signal into a digital signal. The digital signal held in each first memory 70 is transferred to the corresponding second memory 80, and is then output to outside of a chip.

In the present exemplary embodiment, the example using the counters 90 and 91 common to a plurality of circuits is illustrated; however, a configuration in which a common count clock is supplied to each of signal processing circuits and counters are disposed for respective circuits corresponding to the signal lines is also common. The exemplary embodiment of the disclosure is applicable to such a configuration.

Figure 3:
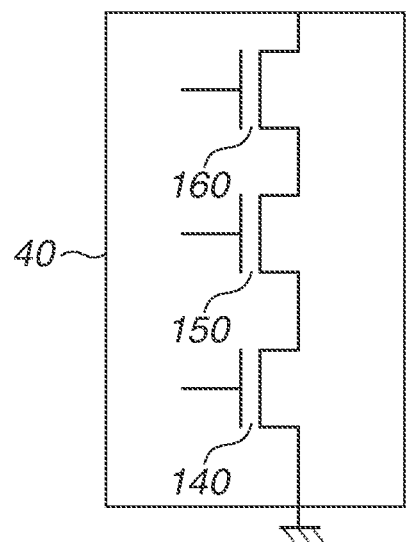
FIG. 3 is a schematic diagram of the photoelectric conversion device according to the first exemplary embodiment.

FIG. 3 illustrates an example of a specific circuit configuration of each of the current sources 40.

The current source illustrated in FIG. 3 includes a current source transistor 140, a cascode transistor 150, and a switch transistor 160. The current source transistor 140 is grounded, and is connected to the cascode transistor 150. The cascode transistor 150 is connected to the switch transistor 160, and the switch transistor 160 is connected to the corresponding signal line 30.

The current source transistor 140 supplies a current corresponding to a gate voltage to the corresponding signal line 30 via the cascode transistor 150 and the switch transistor 160.

The cascode transistor 150 determines a drain-source voltage of the current source transistor 140 based on a gate voltage. As a result, even when a potential of the corresponding signal line 30 is varied, it is possible to suppress variation of the drain-source voltage of the current source transistor 140, and to reduce current variation.

The switch transistor 160 is turned off for power saving to reduce power.

A circuit similar to the circuit of each of the current sources 40 can be used in each of the current sources 41 supplying currents to the signal lines 31.

Figure 4:
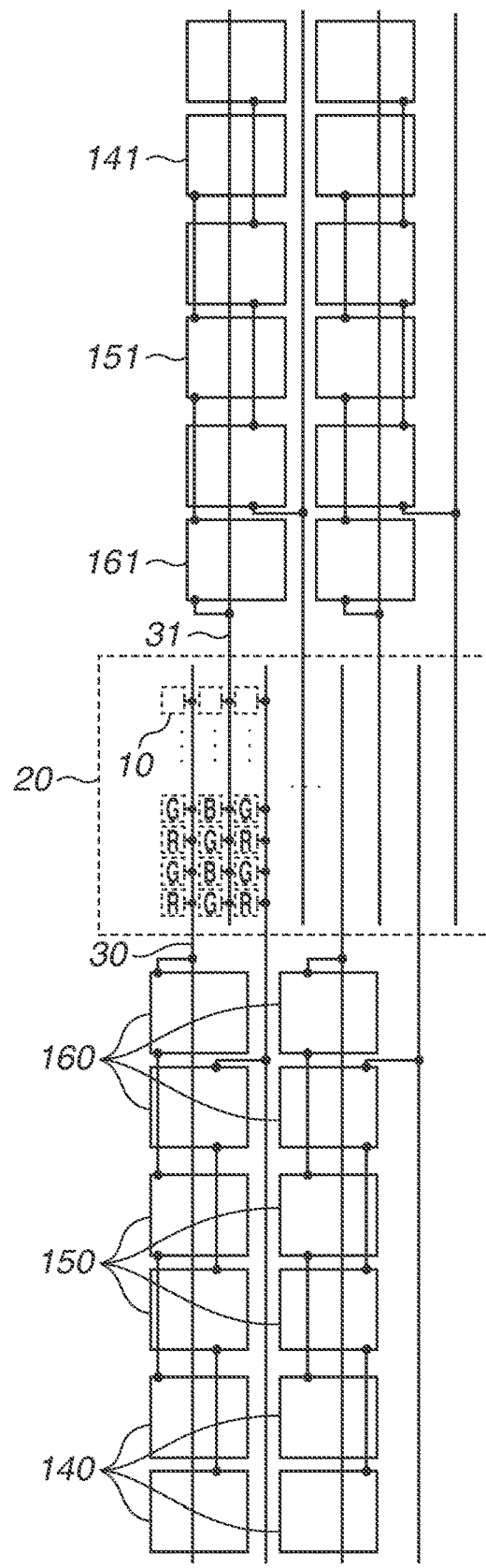
FIG. 4 is a schematic diagram of the photoelectric conversion device according to the first exemplary embodiment.

FIG. 4 illustrates an example of layout of the current sources 40 and the current sources 41.

In the following description, a row on a lower side in the drawing is regarded as a first row, and a column on a left side is regarded as a first column. This holds true for the following exemplary embodiments. Further, FIG. 5 illustrates a comparative example of the layout.

Figure 5:
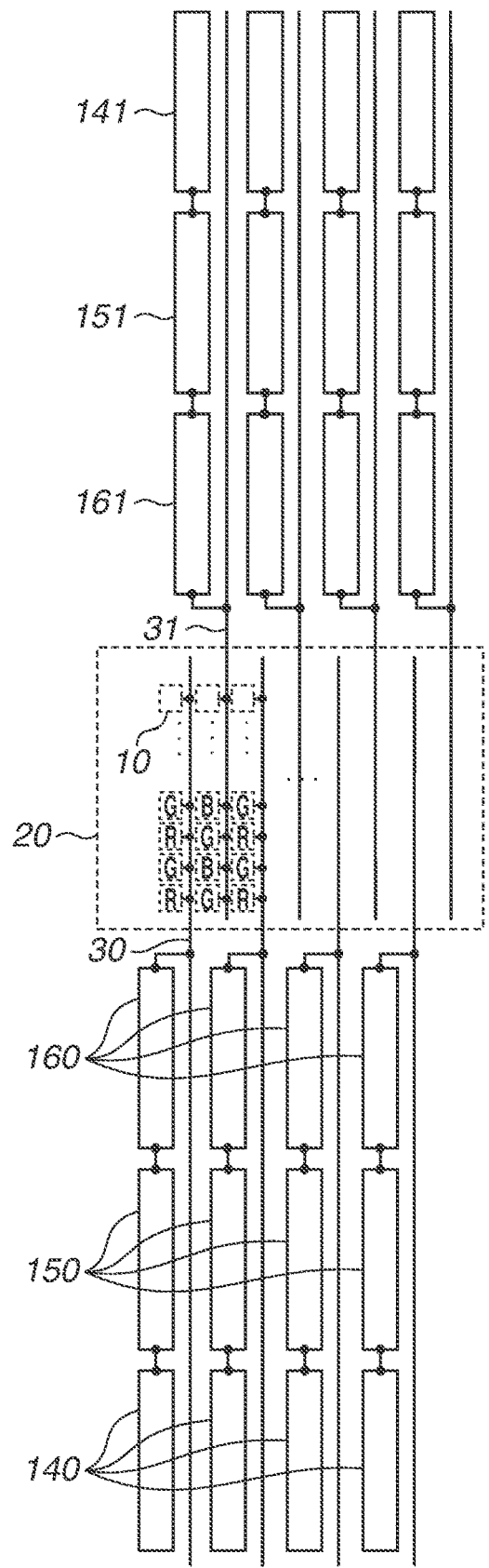
FIG. 5 is a schematic diagram of a comparative example of the photoelectric conversion device according to the first exemplary embodiment.

In FIG. 5, the signals of the signal lines 30 corresponding to odd columns are read out to a lower side of the pixel array 20, and the signals of the signal lines 31 corresponding to even columns are read out to an upper side of the pixel array 20, as in Japanese Patent Application Laid-Open No. 2016-92791. In a case of a Bayer color filter array as illustrated in FIG. 5, when the signals of the red pixels are read out via the signal lines 30, the signals of the green pixels are read out via the signal lines 31.

Further, in each of the signal lines, the switch transistor 160, the cascode transistor 150, and the current source transistor 140 configuring one current source are arranged in the column direction. In this case, the current source transistors 140 of the respective current sources are one-dimensionally arranged in the row direction.

In contrast, in the photoelectric conversion device according to the present exemplary embodiment illustrated in FIG. 4, three types of transistors connected to one signal line 30 and three types of transistors connected to another signal line 30 are arranged such that transistors having the same function are adjacent to each other in the column direction. At this time, the transistors are still one-dimensionally arranged in the row direction. In such an arrangement, the elements can be closely arranged while centroid positions of the elements are brought closer to one another. As a result, process variation of elements, temperature difference, difference in power supply resistors, and the like are reduced to uniformize characteristics of the elements, which makes it possible to suppress difference among the columns of the same color.

Note that the transistors having the same function indicates that the transistors have the same connection relationship. For example, when gates of two transistors are connected to a common control line, one of a source and a drain of each of the two transistors is connected to a corresponding signal line and the other of each of the transistors is supplied with a common bias, the two transistors have the same function. The transistors having the same function have the same size.

As described above, in the present exemplary embodiment, it is possible to suppress image quality deterioration caused by characteristic difference among the pixel columns.

In the present exemplary embodiment, the example in which the switch transistors 160, the cascode transistors 150, and the current source transistors 140 are each adjacent to each other in the column direction has been described. However, the disclosure is not limited thereto, and only a part of the three types of transistors included in the current sources may be adjacent to each other in the column direction.

In FIG. 4, the three types of transistors connected to one signal line 30 and the three types of transistors connected to another signal line 30 are alternately arranged; however, the arrangement is not limited thereto as long as the transistors having the same function are adjacent to each other. For example, the switch transistor 160 and the cascode transistor 150 connected to one signal line 30 may be arranged between the switch transistor 160 and the cascode transistor 150 connected to another signal line 30.

At this time, the elements that may contribute to the characteristic difference more may be made adjacent to each other in the column direction.

For example, the switch transistors 160 may be arranged in a manner similar to the arrangement in FIG. 5, whereas the cascode transistors 150 and the current source transistors 140 may be adjacent in the column direction.

Further, each of the current sources 40 and the current sources 41 is not limited to the example illustrated in FIG. 3. Each of the current sources 40 and the current sources 41 may include, for example, a sample-and-hold circuit holding a voltage at the gate of the current source transistor 140.

In the present exemplary embodiment, the example in which the transistors included in the current sources 40 and the current sources 41 are arranged adjacently in the column direction has been described; however, the circuit having the elements arranged in such a manner is not limited to the current sources. For example, the elements included in the comparators 60 and 61 may be arranged in the same manner. The elements are, for example, transistors. Further, the first memories 70, the first memories 71, the second memories 80, and the second memories 81 may be one-dimensionally arranged, whereas the current sources 40, the current sources 41, the comparators 60, and the comparators 61 may be arranged over a plurality of rows and a plurality of columns in a two-dimensional array.

Figure 6:
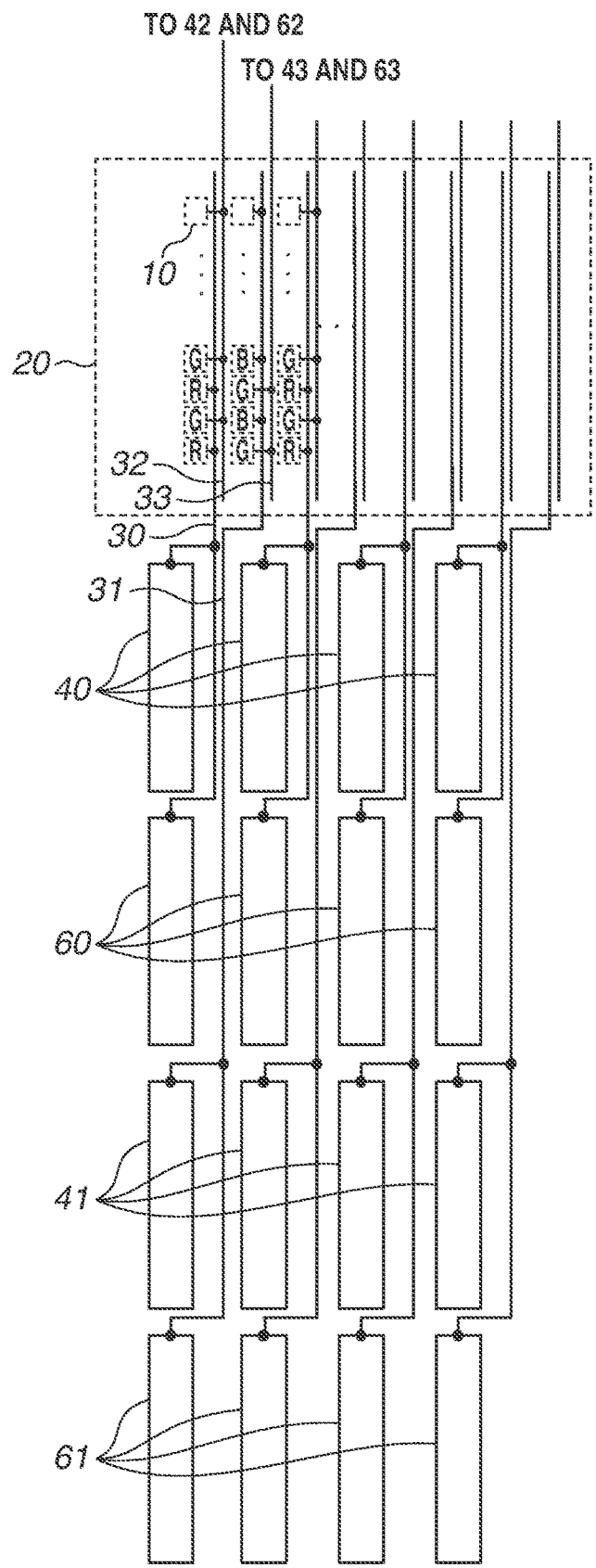
FIG. 6 is a schematic diagram of a photoelectric conversion device according to a second exemplary embodiment.

A second exemplary embodiment will be described. FIG. 6 is a schematic diagram of a photoelectric conversion device according to the second exemplary embodiment. In the following, the description common to the first exemplary embodiment will be omitted, and differences with FIG. 4 will be mainly described.

In the photoelectric conversion device illustrated in FIG. 6, one pixel column includes two signal lines in the pixel array 20. The signal lines 30 and signal lines 32 correspond to the odd columns, and the signal lines 31 and signal lines 33 correspond to the even columns.

The signal lines 30 are used to read out signals of the pixels in the odd columns and the odd rows, to the lower side of the pixel array 20. The signal lines 31 are used to read out signals of the pixels in the even columns and the even rows, to the lower side of the pixel array 20. The signal lines 32 are used to read out signals of the pixels in the even columns and the even rows, to the upper side of the pixel array 20. The signal lines 33 are used to read out signals of the pixels in the odd columns and the odd rows, to the upper side of the pixel array 20.

In the case of the Bayer color filter array, when the signals of the red pixels are read out via the signal lines 30, the signals of the blue pixels are read out via the signal lines 31. As described above, in the present exemplary embodiment, unlike the first exemplary embodiment, the signals of the pixels read out to the lower side of the pixel array 20 at the same time correspond to two different colors. The signals read out via the signal lines 30 are input to the comparators 60, and the signals read out via the signal lines 31 are input to the comparators 61.

At this time, when the comparators converting the readout signals from the analog signals into the digital signals are adjacently arranged, outputs of the comparators may mutually interfere when the outputs of the comparators change, which may cause color mixture.

Therefore, in the photoelectric conversion device illustrated in FIG. 6, the comparators 60 and the comparators 61 are separately arranged such that the comparators 60 and the comparators 61 are not adjacent to each other and the comparators and the current sources are alternately arranged in each column in a top view. In other words, the comparators 60 are arranged between the current sources 40 and the current sources 41, and the comparators 61 are arranged in a rear stage of the current sources in a top view. Such an arrangement makes it possible to suppress occurrence of color mixture caused by mutual interference of the outputs of the comparators 60 and the comparators 61 when the outputs of the comparators 60 and the comparators 61 change. Note that the top view used herein indicates overviewing of a light incident surface of a semiconductor substrate.

Further, as compared with a case where the current sources 40 and the current sources 41 are closely arranged without being shifted in the column direction, it is possible to more closely arrange the current sources 40 or the current sources 41 that are used to read out the signals corresponding to the same color. In other words, it is possible to separately arrange an area of the current sources corresponding to the odd columns and an area of the current sources corresponding to the even columns. This holds true for the arrangement of the comparators 60 and the comparators 61. Such an arrangement makes it possible to suppress image quality deterioration caused by characteristic difference among the pixel columns of the same color.

As described above, in the present exemplary embodiment, it is possible to suppress image quality deterioration caused by occurrence of the color mixture and the characteristic difference among the pixel columns of the same color.

Figure 7:
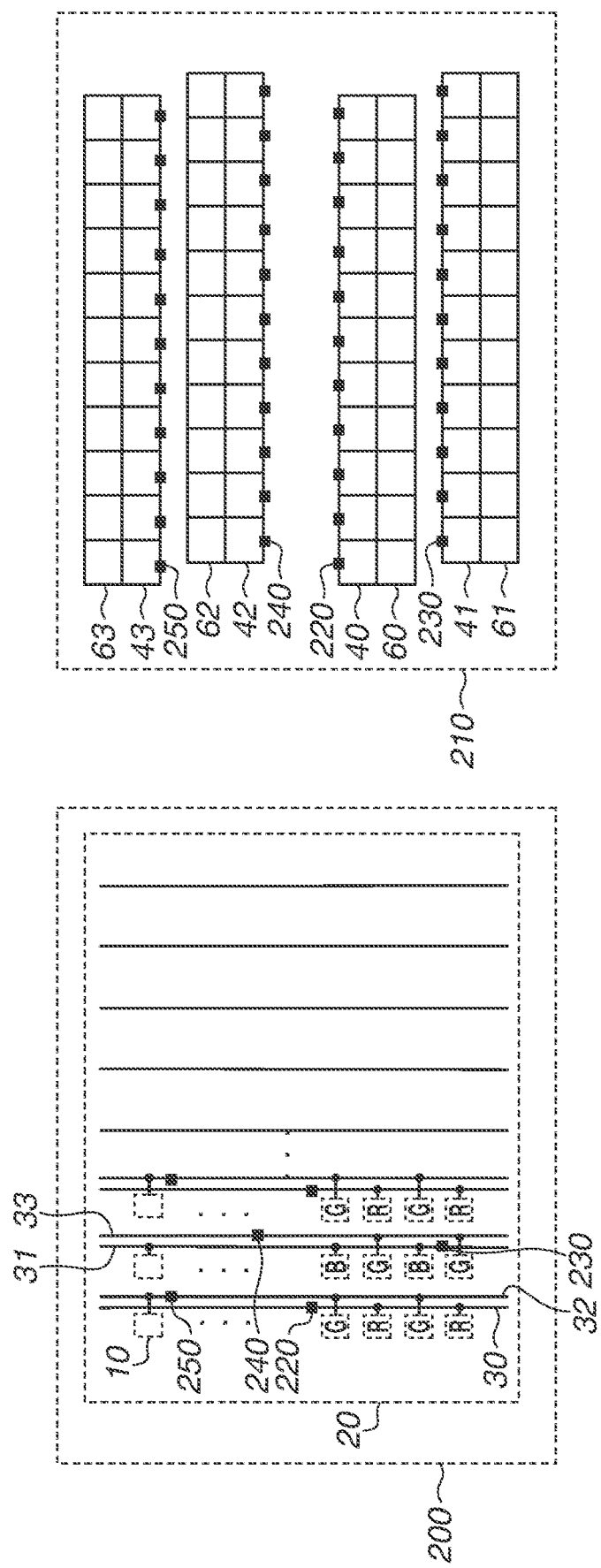
FIG. 7 is a schematic diagram of a photoelectric conversion device according to a third exemplary embodiment.

A third exemplary embodiment will be described. FIG. 7 is a schematic diagram of a photoelectric conversion device according to the third exemplary embodiment. In the following, the description common to the first and second exemplary embodiments will omitted, and differences with FIG. 6 will be mainly described.

The photoelectric conversion device illustrated in FIG. 7 has a stacked-layer structure, and includes a pixel substrate 200 and a circuit substrate 210. The pixel substrate 200 includes the pixel array 20, and current sources 40, 41, 42, and 43 and comparators 60, 61, 62, and 63 are provided on the circuit substrate 210. Further, the signal lines 30, 31, 32, and 33 of the pixel substrate 200 are connected to the current sources 40, 41, 42, and 43 of the circuit substrate 210 by inter-substrate joints 220, 230, 240, and 250.

In the element arrangement in FIG. 6 according to the second exemplary embodiment, a distance from the pixel array 20 to each of the current sources 40 is different from a distance from the pixel array 20 to each of the current sources 41. Thus, a length of each of the signal lines 31 is longer than a length of each of the signal lines 30. Therefore, a parasitic capacitance attached to each of the signal lines 31 is greater than a parasitic capacitance attached to each of the signal lines 30, which may cause image quality deterioration and operation speed deterioration.

Therefore, in the present exemplary embodiment, the lengths of the signal lines and the parasitic capacitances in the case where the current sources 40 and the current sources 41 are separately arranged are made uniform among the columns by forming the photoelectric conversion device to have the stacked-layer structure.

As described above, in the present exemplary embodiment, it is possible to suppress image quality deterioration and operation speed deterioration caused by difference in parasitic capacitance of the signal lines.

Figure 8:
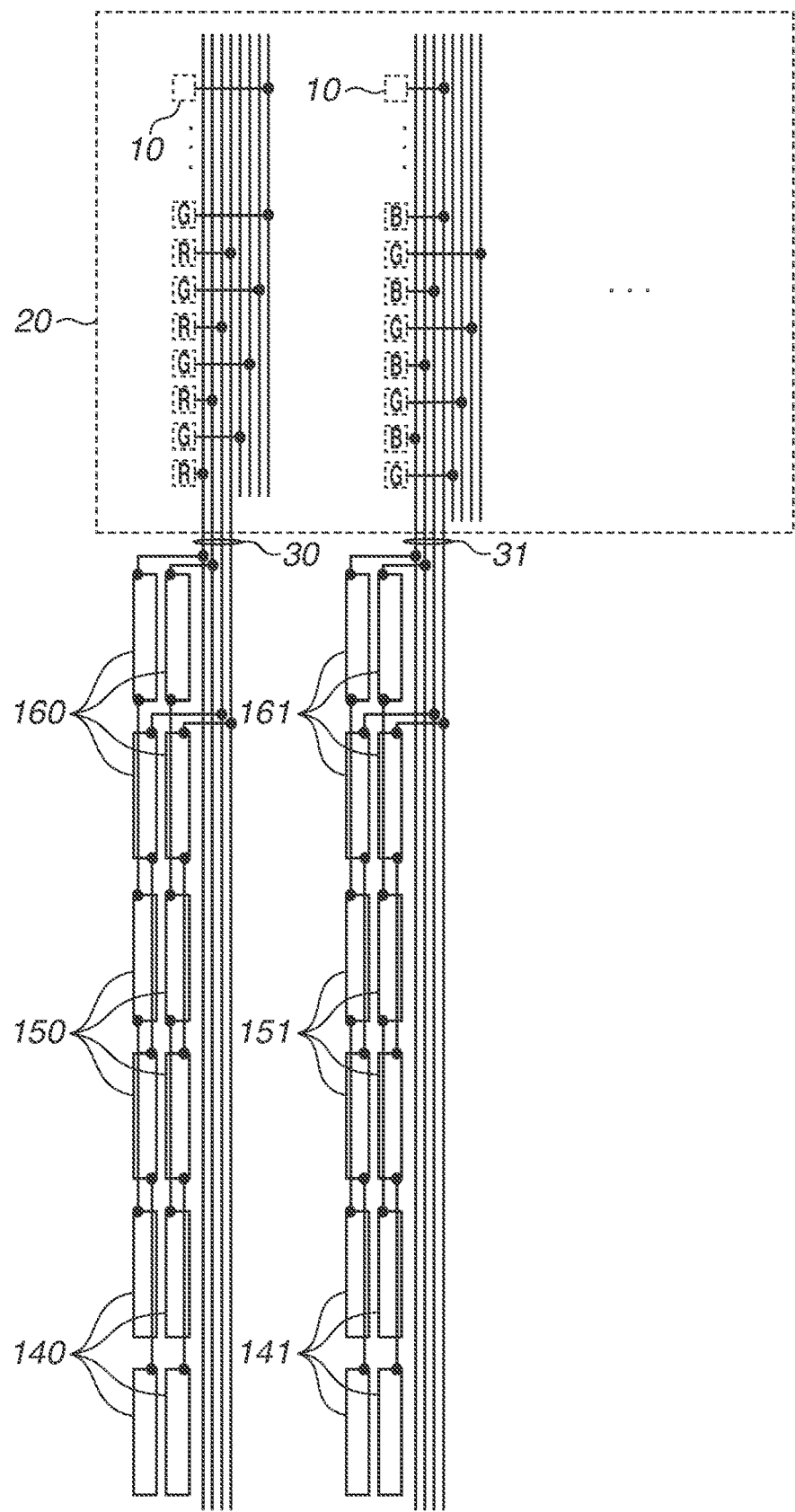
FIG. 8 is a schematic diagram of a photoelectric conversion device according to a fourth exemplary embodiment.

A fourth exemplary embodiment will be described. FIG. 8 is a schematic diagram of a photoelectric conversion device according to the fourth exemplary embodiment. In the following, the description common to the first to third exemplary embodiments will be omitted, and differences with FIG. 4 will be mainly described.

In the photoelectric conversion device illustrated in FIG. 8, the pixels arranged in one column of the pixel array 20 include eight signal lines. As compared with the first exemplary embodiment, the number of signal lines 30 used to read out the signals of the red pixels in the even columns and the odd rows is increased to four. Further, the number of signal lines 31 used to read out signals of the blue pixels in the odd columns and the even rows is also increased to four. Accordingly, four current sources are arranged for one pixel column.

In the present exemplary embodiment, four switch transistors 160, four cascode transistors 150, and four current source transistors 140 forming four current sources 40 are each arranged over a plurality of rows and a plurality of columns in a two-dimensional array. Likewise, four switch transistors 161, four cascode transistors 151, and four current source transistors 141 forming four current sources 41 are each arranged over a plurality of rows and a plurality of columns in a two-dimensional array.

For example, the four signal lines 30 are distinguished as a signal line 30(a), a signal line 30(b), a signal line 30(c), and a signal line 30(d), and the current sources and elements thereof arranged in each line are also distinguished with the corresponding alphabets (a) to (d). In the signal line 30(a), a switch transistor 160(a), a cascode transistor 150(a), and a current source transistor 140(a) are arranged. The elements for the signal lines 30(b) to 30(d) are arranged in a similar manner.

These transistors are arranged in a two-dimensional array such that the elements having the same function in each column are gathered.

A specific arrangement is as follows. First, the switch transistor 160(a), a switch transistor 160(c), the cascode transistor 150(a), a cascode transistor 150(c), the current source transistor 140(a), and a current source transistor 160(c) are arranged in order in the column direction in a top view. The elements for the signal line 30(b) and the signal line 30(d) are arranged in a similar manner More specifically, a switch transistor 160(b), a switch transistor 160(d), a cascode transistor 150(b), a cascode transistor 150(d), a current source transistor 140(b), and a current source transistor 140(d) are arranged in order in the column direction in a top view.

At this time, the switch transistor 160(a) and the switch transistor 160(c) are respectively adjacent to the switch transistor 160(b) and the switch transistor 160(d) in the row direction. This holds true for the cascode transistors 150 and the current source transistors 140.

In other words, in a case where attention is paid to the four switch transistors 160, the switch transistor 160(a) and the switch transistor 160(c) are adjacent to each other in the column direction, and the switch transistor 160(a) and the switch transistor 160(b) are adjacent to each other in the row direction. The four switch transistors 160 are arranged over a plurality of rows and a plurality of columns in a two-dimensional array. The four cascode transistors 150 and the four current source transistors 140 are each also arranged over a plurality of rows and a plurality of columns in a two-dimensional array.

This makes it possible to closely arrange the elements reading out the signals of the different rows of the same color. As a result, process variation of elements, temperature difference, difference in power supply resistors, and the like are reduced to uniformize characteristics of the elements, which makes it possible to suppress difference among the pixel rows of the same color.

As described above, in the present exemplary embodiment, it is possible to suppress image quality deterioration caused by characteristic difference among the pixel rows.

In the present exemplary embodiment, the switch transistor 160 and 161, the cascode transistors 150 and 151, and the current source transistors 140 and 141 are each closely arranged. However, the circuits processing the signals of the different colors may be separately arranged as described in the second exemplary embodiment and the third exemplary embodiment. This makes it possible to further suppress occurrence of the color mixture and difference among the columns of the same color.

Further, as described in the third exemplary embodiment, the stacked-layer structure may be adopted. This makes it possible to further suppress image quality deterioration and operation speed deterioration caused by difference in parasitic capacitance of the signal lines.

In the present exemplary embodiment, the case where the number of signal lines per one pixel column is eight is described as an example; however, the disclosure is not limited thereto. For example, the number of signal lines per one pixel column may be an optional number of four or more, such as 12, 16, 20, and 24.

Figure 9:
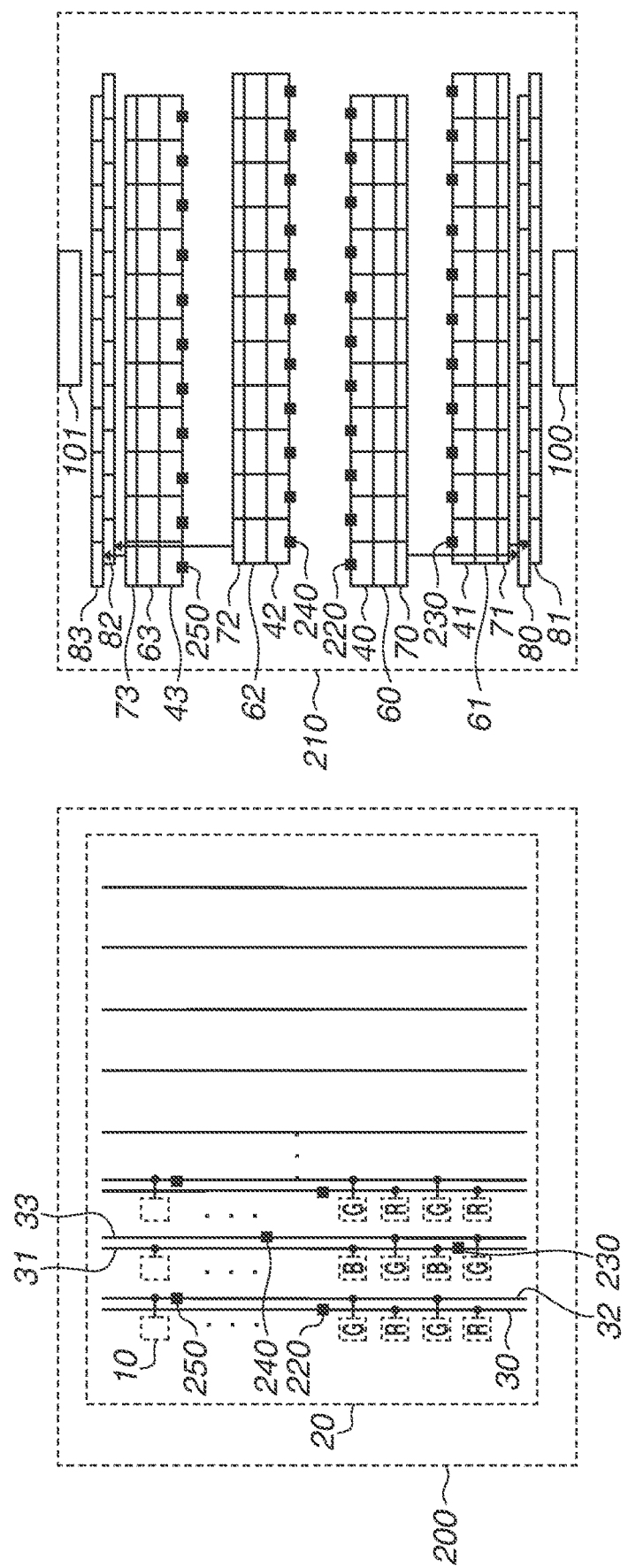
FIG. 9 is a schematic diagram of a photoelectric conversion device according to a fifth exemplary embodiment.

A fifth exemplary embodiment will be described. FIG. 9 is a schematic diagram of a photoelectric conversion device according to the fifth exemplary embodiment. In the following, the description common to the first to fourth exemplary embodiments will be omitted, and differences with FIG. 7 will be mainly described.

The photoelectric conversion device illustrated in FIG. 9 has a stacked-layer structure as in FIG. 7. In addition to the elements illustrated in FIG. 7, first memories 70, 71, 72, and 73, second memories 80, 81, 82, and 83, and the output circuits 100 and 101 are illustrated. Each of the first and second memories is a latch circuit.

A lower half of the circuit substrate 210 will be described. The elements in a latter stage of the signal lines are arranged in order of the current sources 40, the comparators 60, the first memories 70, the current sources 41, the comparators 61, the first memories 71, the second memories 80, and the second memories 81.

In other words, a part of a second column circuit group (current sources 41, comparators 61, first memories 71, and second memories 81) are arranged between the first memories 70 and the second memories 80 of a first column circuit group (current sources 40, comparators 60, first memories 70, and second memories 80).

When the comparators 60 and the first memories 70 are closely arranged, it is possible to reduce output wire lengths of the comparators 60 and the parasitic capacitances. This suppresses power supply variation when the outputs of the comparators change, which makes it possible to suppress interference among the comparators 60, and to suppress image quality deterioration.

Further, when the second memories 80 are arranged on the lower side of the first memories 71, it is possible to reduce a distance between each of the second memories 80 and the output circuit 100, and to prevent occurrence of troubles when the signals are horizontally transferred to the output circuit 100. This holds true for an upper half of the circuit substrate 210.

As described above, in the present exemplary embodiment, a part of the second column circuit group is arranged between the first memories 70 and the second memories 80 of the first column circuit group. This suppresses image quality deterioration caused by power supply variation.

Figure 10:
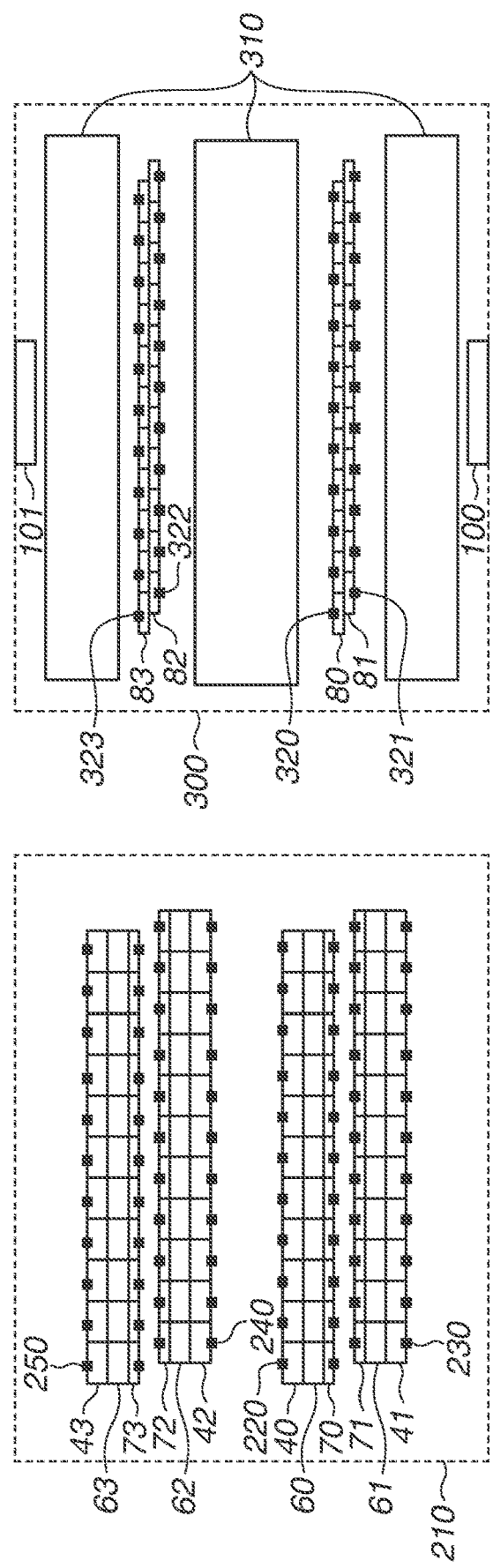
FIG. 10 is a schematic diagram of a photoelectric conversion device according to a sixth exemplary embodiment.

A sixth exemplary embodiment will be described. FIG. 10 is a schematic diagram of a photoelectric conversion device according to the sixth exemplary embodiment. The description common to the first to fifth exemplary embodiments will be omitted, and differences with FIG. 9 will be mainly described below.

The photoelectric conversion device illustrated in FIG. 10 further includes a second circuit substrate 300 in addition to the pixel substrate 200 and the circuit substrate 210. The second memories 80, 81, 82, and 83, the output circuits 100 and 101, and frame memories 310 are arranged on the second circuit substrate 300. The pixel substrate 200 is similar to the pixel substrate 200 illustrated in FIG. 9. Therefore, illustration of the pixel substrate 200 is omitted.

A lower half of the second circuit substrate 300 will be described. The first memories 70 and 71 arranged on the circuit substrate 210 and the second memories 80 and 81 arranged on the second circuit substrate 300 are connected via inter-substrate joints 320 and 321. The signals held by the second memories 80 and 81 are transferred to the frame memories 310, and are then output to outside of the chip from the output circuit 100.

In the present exemplary embodiment, the second memories 80 and 81 are provided on the second circuit substrate 300, which enables arrangement in which signal transfer lines from the first memories 70 to the second memories 80 do not pass through the current sources 41 and the comparators 61. This makes it possible to prevent the digital signal transmission from interfering with the current sources 41 and the comparators 61. This holds true for an upper half of the second circuit substrate 300.

As described above, in the present exemplary embodiment, in the configuration in which a part of the second column circuit group is arranged between the first memories 70 and the second memories 80 of the first column circuit group, a stacked-layer structure of three layers is adopted. As a result, analog units handling analog signals and digital units handling digital signals are separated, which makes it possible to prevent image quality deterioration caused by interference of the digital signal transmission of the first column circuit group with the analog circuits of the second column circuit group.

In the present exemplary embodiment, the second memories 80 and 81 and subsequent elements are provided on the second circuit substrate 300; however, the disclosure is not limited thereto. For example, the first memories 70 and 71 may also be provided on the second circuit substrate 300, and the comparators 60 and 61 and the first memories 70 and 71 may be connected via inter-substrate joints.

Further, in the present exemplary embodiment, the current sources 41, the comparators 61, and the first memories 71 are arranged inversely in an up-and-down direction to the arrangement of the current sources 40, the comparators 60, and the first memories 70. In other words, the arrangement is flipped in the up-and-down direction. As a result, in the second circuit substrate 300, it is possible to closely arrange the second memories 80 and 81, and to realize area saving by an effect that a control circuit (not illustrated) can be made common to the second memories 80 and 81 or control lines can be made common to the second memories 80 and 81.

Figure 11:
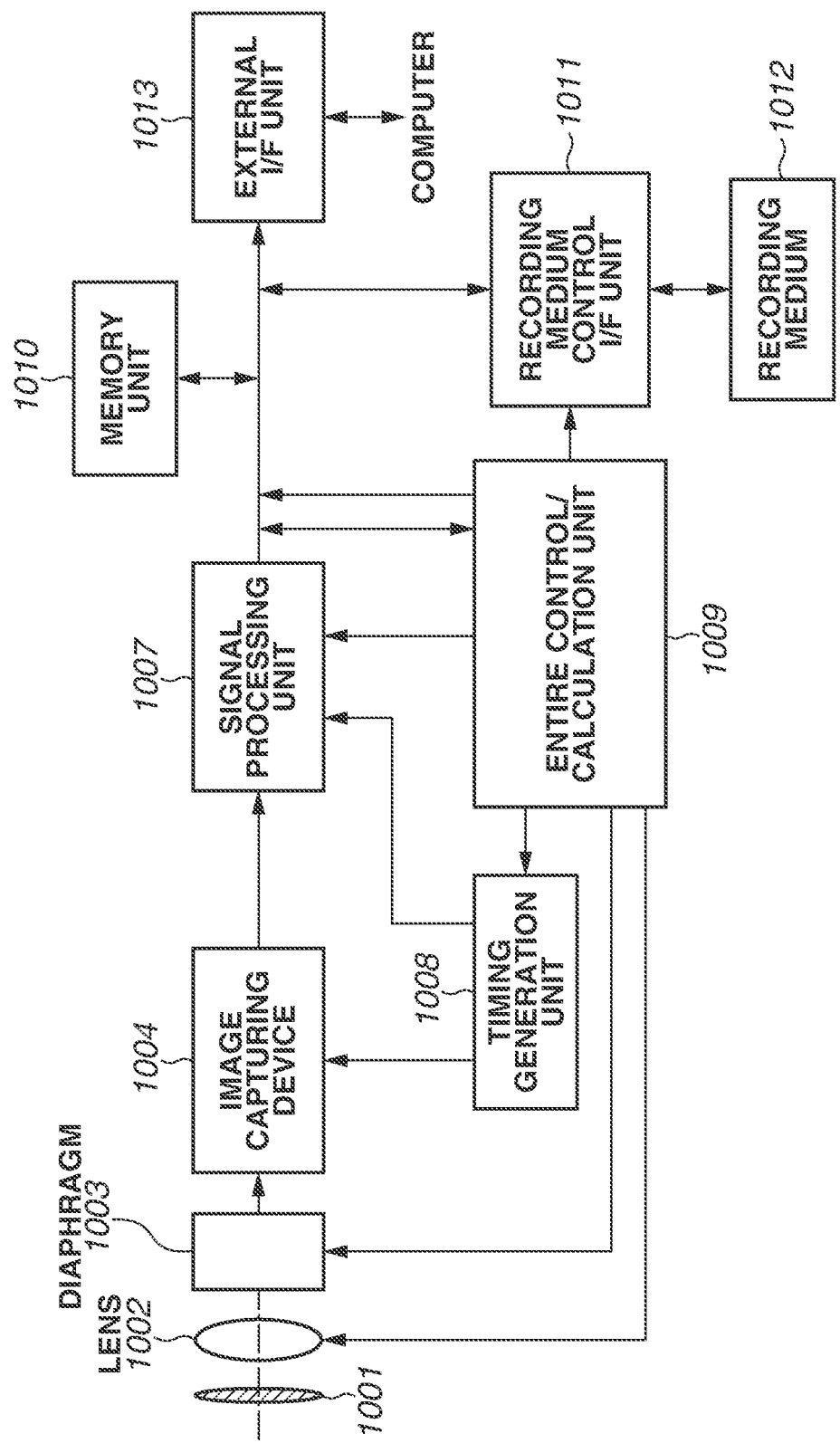
FIG. 11 is a diagram illustrating a configuration of a photoelectric conversion system according to a seventh exemplary embodiment.

A photoelectric conversion system according to a seventh exemplary embodiment is described with reference to FIG. 11. FIG. 11 is a block diagram illustrating a schematic configuration of the photoelectric conversion system according to the present exemplary embodiment.

The photoelectric conversion devices described in the above-described first to sixth exemplary embodiments are each applicable to various photoelectric conversion systems. Examples of the applicable photoelectric conversion system include a digital still camera, a digital camcorder, a monitoring camera, a copier, a facsimile, a mobile phone, an on-vehicle camera, and an observation satellite. Further, a camera module including an optical system such as a lens, and an image capturing device is also included in the photoelectric conversion system. FIG. 11 is a block diagram of a digital still camera as an example of the photoelectric conversion system.

The photoelectric conversion system illustrated in FIG. 11 includes an image capturing device 1004 as an example of the photoelectric conversion device, and a lens 1002 forming an optical image of an object on the image capturing device 1004. The photoelectric conversion system further includes a diaphragm 1003 varying a quantity of light passing through the lens 1002, and a barrier 1001 protecting the lens 1002. The lens 1002 and the diaphragm 1003 configure an optical system condensing light to the image capturing device 1004. The image capturing device 1004 is the photoelectric conversion device according to any of the above-described exemplary embodiments, and converts the optical image formed by the lens 1002 into an electric signal.

The photoelectric conversion system further includes a signal processing unit 1007 that is an image generation unit generating an image by processing an output signal output from the image capturing device 1004. The signal processing unit 1007 performs various kinds of correction and compression as necessary, and outputs image data. The signal processing unit 1007 may be provided on a semiconductor substrate provided with the image capturing device 1004, or may be provided on a semiconductor substrate different from the semiconductor substrate provided with the image capturing device 1004.

The photoelectric conversion system further includes a memory unit 1010 temporarily storing the image data, and an external interface unit (external I/F unit) 1013 for communication with an external computer, etc. The photoelectric conversion system further includes a recording medium 1012 performing recording or readout of captured image data, such as a semiconductor memory, and a recording medium control interface unit (recording medium control I/F unit) 1011 performing recording or readout of the recording medium 1012. The recording medium 1012 may be incorporated in the photoelectric conversion system or may be detachable.

The photoelectric conversion system further includes an entire control/calculation unit 1009 performing various kinds of calculation and control of the whole of the digital still camera, and a timing generation unit 1008 outputting various kinds of timing signals to the image capturing device 1004 and the signal processing unit 1007. The timing signals and other signals may be input from outside, and the photoelectric conversion system at least include the image capturing device 1004 and the signal processing unit 1007 processing the output signal output from the image capturing device 1004.

The image capturing device 1004 outputs a captured image signal to the signal processing unit 1007. The signal processing unit 1007 performs predetermined signal processing on the captured image signal output from the image capturing device 1004, and outputs the image data. The photoelectric conversion system generates an image by using the image data.

As described above, according to the present exemplary embodiment, it is possible to realize the photoelectric conversion system adopting the photoelectric conversion device (image capturing device) according to any of the above-described exemplary embodiments.

Figure 12A:
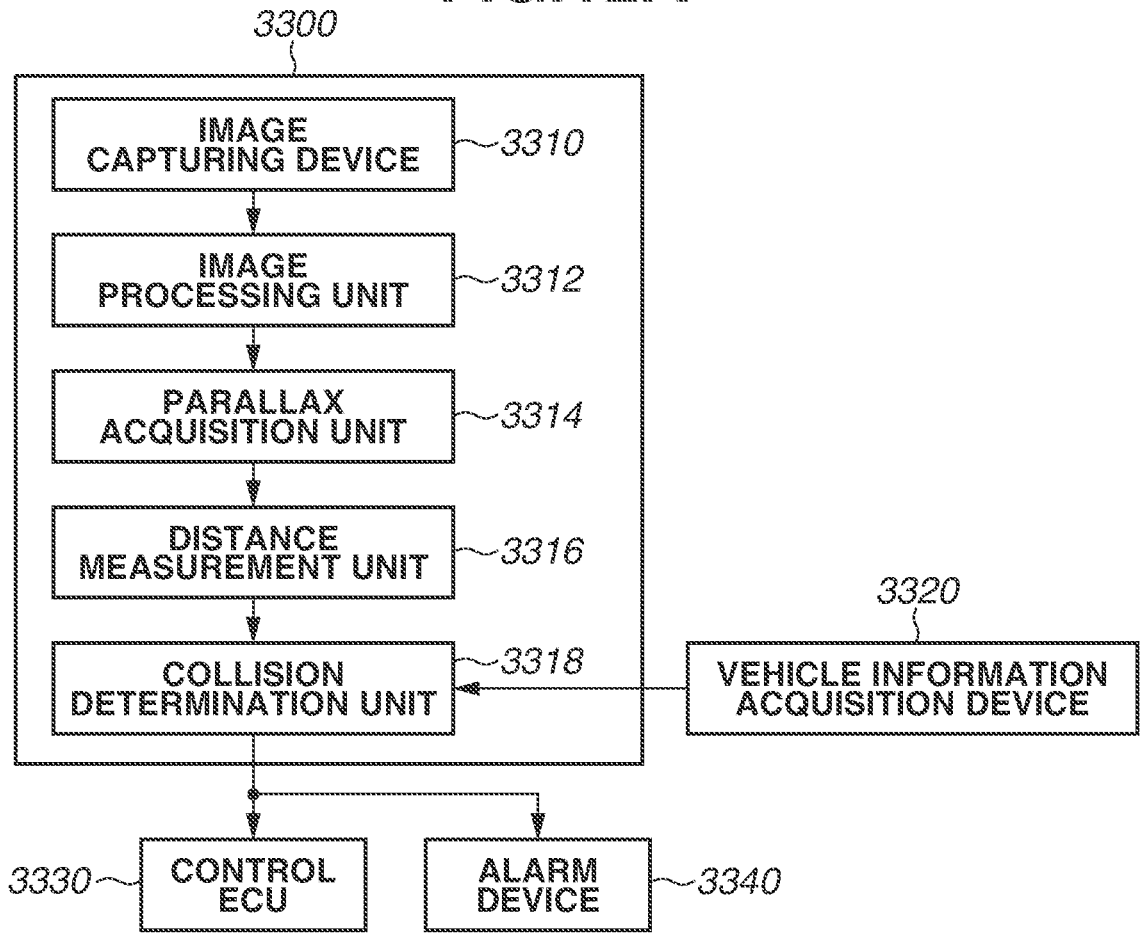
FIGS. 12A and 12B are diagrams illustrating a configuration and operation of a moving body according to an eighth exemplary embodiment.
Figure 12B:
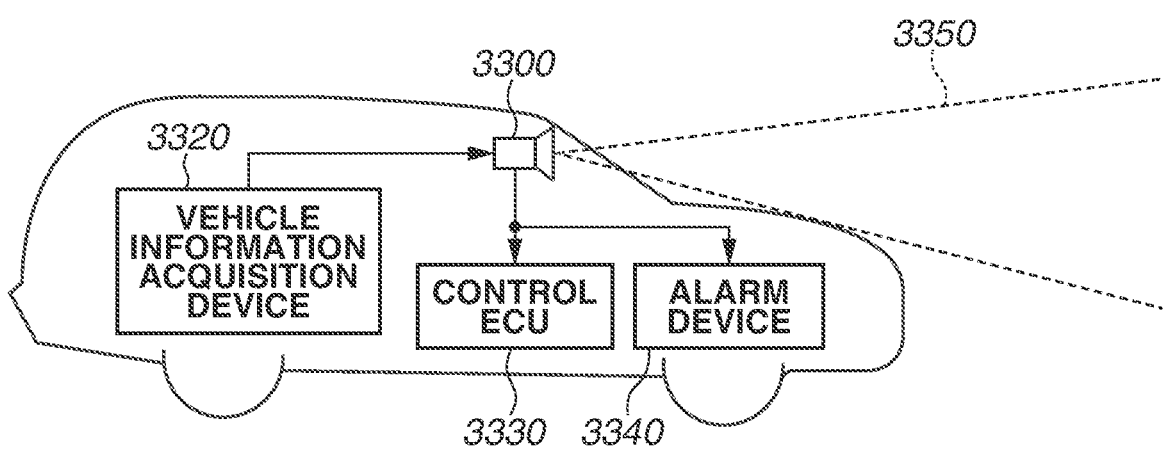

A photoelectric conversion system and a moving body according to an eighth exemplary embodiment will be described with reference to FIGS. 12A and 12B. FIGS. 12A and 12B are diagrams illustrating configurations of the photoelectric conversion system and the moving body according to the present exemplary embodiment.

FIG. 12A illustrates an example of the photoelectric conversion system relating to an on-vehicle camera. A photoelectric conversion system 3300 includes an image capturing device 3310. The image capturing device 3310 is the photoelectric conversion device (image capturing device) according to any of the above-described exemplary embodiments. The photoelectric conversion system 3300 includes an image processing unit 3312 that performs image processing on a plurality of pieces of image data acquired by the image capturing device 3310, and a parallax acquisition unit 3314 that calculates parallax (phase difference of parallax image) from the plurality of pieces of image data acquired by the photoelectric conversion system 3300. The photoelectric conversion system 3300 further includes a distance acquisition unit 316 that calculates a distance to an object based on the calculated parallax, and a collision determination unit 3318 that determines whether there is possibility of collision based on the calculated distance. The parallax acquisition unit 3314 and the distance acquisition unit 3316 are examples of a distance information acquisition unit acquiring information on the distance to the object. In other words, the information on the distance is information about the parallax, a defocus amount, the distance to the object, and the like. The collision determination unit 3318 may determine collision possibility by using any of the information on the distance. The distance information acquisition unit may be realized by exclusively designed hardware, or may be realized by a software module. Further, the distance information acquisition unit may be realized by a field programmable gate array (FPGA), an application specific integrated circuit (ASIC), or the like, or may be realized by a combination thereof.

The photoelectric conversion system 3300 is connected to a vehicle information acquisition device 3320, and can acquire vehicle information such as a vehicle speed, a yaw rate, and a steering angle. Further, the photoelectric conversion system 3300 is connected to a control electric control unit (ECU) 3330 which is a control unit that outputs a control signal causing a vehicle to generate breaking force, based on a result of the determination by the collision determination unit 3318. Further, the photoelectric conversion system 3300 is also connected to an alarm device 3340 issuing an alarm to a driver, based on the result of the determination by the collision determination unit 3318. For example, in a case where the collision possibility is high as the result of the determination by the collision determination unit 3318, the control ECU 3330 performs vehicle control to avoid a collision or reduce damage by applying a brake, pushing back an accelerator, suppressing engine output, or the like. The alarm device 3340 issuing a warning to a user by sounding an alarm such as sound, displaying alarm information on a screen of a car navigation system or the like, vibrating a seat belt or a steering wheel, or the like.

In the present exemplary embodiment, the photoelectric conversion system 3300 captures an image around the vehicle, for example, a front side or a rear side. FIG. 12B illustrates the photoelectric conversion system in a case where an image on the front side of the vehicle (image capturing range 3350) is captured. The vehicle information acquisition device 3320 transmits an instruction to the photoelectric conversion system 3300 or the image capturing device 3310. Such a configuration makes it possible to further improve accuracy of ranging.

In the above description, the example in which control is performed to avoid collision with another vehicle has been described; however, the photoelectric conversion system is also applicable to control for automatic driving following another vehicle, control for automatic driving so as to prevent the vehicle from deviating from a lane, or the like. Further, the photoelectric conversion system is not limited to a vehicle such as an automobile, and is applicable to a moving body (moving apparatus) such as a vessel, an aircraft, and an industrial robot. In addition, the photoelectric conversion system is not limited to the moving body, and is widely applicable to an apparatus using object recognition, such as an intelligent transportation system (ITS).

MODIFICATIONS

The disclosure is not limited to the above-described exemplary embodiments, and can be variously modified.

For example, an example in which a part of the configuration of any of the exemplary embodiments is added to another exemplary embodiment, and an example in which a part of the configuration of any of the exemplary embodiments is replaced with a part of the configuration of another exemplary embodiment are also included in the exemplary embodiments of the disclosure.

The photoelectric conversion system according to each of the above-described seventh and eighth exemplary embodiments is an example of the photoelectric conversion system to which the photoelectric conversion device may be applied, and the photoelectric conversion system to which the photoelectric conversion device according to the disclosure is applicable is not limited to the configurations illustrated in FIG. 11 and FIGS. 12A and 12B.

The above-described exemplary embodiments are merely embodiment examples for implementation of the disclosure, and the technical scope of the disclosure should not be limitedly interpreted by the above-described exemplary embodiments. In other words, the disclosure can be implemented in various forms without departing from the technical idea or the main futures of the disclosure.

The disclosure is made in consideration of the above-described issues, and can suppress image quality deterioration.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-215240, filed Dec. 24, 2020, which is hereby incorporated by reference herein in its entirety.

What is claimed is:

1. A device comprising:
a pixel array including a plurality of pixels corresponding to a same color, the plurality of pixels including a first signal line, a second signal line, a third signal line, and a fourth signal line, the first signal line being connected to a first circuit group, the second signal line being connected to a second circuit group, the third signal line being connected to a third circuit group, the fourth signal line being connected to a fourth circuit group; and
a first circuit included in the first circuit group, a second circuit included in the second circuit group and having a function same as a function of the first circuit, a third circuit included in the third circuit group and having a function same as the function of the first circuit, and a fourth circuit included in the fourth circuit group and having a function same as the function of the first circuit, the first circuit, the second circuit, the third circuit, and the fourth circuit being arranged in a plurality of rows and a plurality of columns,
wherein, among the plurality of pixels, pixels including the first signal line, the second signal line, the third signal line, and the fourth signal line are arranged in one line in a first direction of the pixel array.

2. The device according to claim 1,
wherein each of the plurality of pixels includes a color filter, and
wherein peak wavelengths of light corresponding to the color filters are overlapped.

3. The device according to claim 1,
wherein the third circuit group includes the fourth circuit having a function same as a function of the second circuit, and
wherein the second circuit is arranged between the third circuit and the fourth circuit in a top view.

4. The device according to claim 1,
wherein the third circuit group includes the fourth circuit having a function same as a function of the second circuit, and
wherein the fourth circuit is arranged between the third circuit and the second circuit in a top view.

5. The device according to claim 1,
wherein the first circuit is a transistor, and
wherein the third circuit is a transistor having a function same as a function of the first circuit.

6. The device according to claim 1,
wherein the second circuit is a transistor, and
wherein the fourth circuit is a transistor having a function same as a function of the second circuit.

7. The device according to claim 1, wherein a part of the first circuit group is arranged inversely to a part of the second circuit group.

8. The device according to claim 1,
wherein the plurality of pixels is provided on a first semiconductor substrate,
wherein the first and second circuit groups are provided on a second semiconductor substrate, and
wherein a plurality of semiconductor substrates including the first and second semiconductor substrates are stacked.

9. The device according to claim 8,
wherein each of the circuits included in the first and second circuit groups includes analog units and digital units, and
wherein a semiconductor substrate provided with the analog units of the circuits and a semiconductor substrate provided with the digital units are different from each other.

10. The device according to claim 9, wherein the analog units include a current source or a comparator.

11. The device according to claim 9, wherein the digital units include a latch circuit.

12. The device according to claim 1, wherein the first circuit group and the second circuit group respectively include a current source of the first signal line and a current source of the second signal line.

13. The device according to claim 1, wherein the first and second circuit groups each include a comparator.

14. A system, comprising:
the device according to claim 1; and
a processing unit configured to generate an image by using a signal output from the device.

15. A moving body, comprising:
the device according to claim 1; and
a control unit configured to control movement of the moving body by using a signal output from the device.

16. A substrate to be stacked on another substrate, the substrate comprising:

a pixel array including a plurality of pixels corresponding to a same color, the plurality of pixels including a first signal line, a second signal line, a third signal line, and a fourth signal line, the first signal line being connected to a first circuit group, the second signal line being connected to a second circuit group, the third signal line being connected to a third circuit group, the fourth signal line being connected to a fourth circuit group; and a first circuit included in the first circuit group, a second circuit included in the second circuit group and having a function same as a function of the first circuit, a third circuit included in the third circuit group and having a function same as the function of the first circuit, and a fourth circuit included in the fourth circuit group and having a function same as the function of the first circuit, the first circuit, the second circuit, the third circuit, and the fourth circuit being arranged in a plurality of rows and a plurality of columns, wherein, among the plurality of pixels, pixels including the first signal line, the second signal line, the third signal line, and the fourth signal line are arranged in one line in a first direction of the pixel array.

17. A photoelectric conversion device comprising:
a pixel array including a plurality of pixels;
a first signal line;
a second signal line;
a third signal lines; and
a fourth signal line,
wherein the pixel array includes a first pixel column including two or more pixels,
wherein a first pixel included in the first pixel column is connected to a first circuit group via the first signal line,
wherein a second pixel included in the first pixel column is connected to a second circuit group via the second signal line,
wherein a third pixel included in the first pixel column is connected to a third circuit group via the third signal line,
wherein a fourth pixel included in the first pixel column is connected to a fourth circuit group via the fourth signal line,
wherein the first circuit group includes a first circuit,
wherein the second circuit group includes a second circuit having a same function as a function of the first circuit,
wherein the third circuit group includes a third circuit having the same function as the function of the first circuit,
wherein the fourth circuit group includes a fourth circuit having the same function as the function of the first circuit, and
wherein the first circuit and the second circuit are arranged in different columns, the third circuit and the fourth circuit are arranged in different columns, the first circuit and the third circuit are arranged in different rows, and the second circuit and the fourth circuit are arranged in different rows.

18. The photoelectric conversion device according to claim 17, wherein a first color filter configured to cover the first pixel and a second color filter configured to cover the second pixel correspond to a same color.

19. The photoelectric conversion device according to claim 17, wherein the first circuit and the second circuit are arranged in the same row.

20. The photoelectric conversion device according to claim 17, wherein the first circuit and the second circuit are arranged in different columns adjacent to each other.

21. The photoelectric conversion device according to claim 17, wherein a first color filter configured to cover the first pixel, a second color filter configured to cover the second pixel, a third color filter configured to cover the third pixel, a fourth color filter configured to cover the fourth pixel correspond to a same color.

22. The photoelectric conversion device according to claim 17, wherein the first circuit and the second circuit are arranged in the same row, and the third circuit and the fourth circuit are arranged in the same row.

23. The photoelectric conversion device according to claim 17, wherein the first circuit and the second circuit are arranged in different columns adjacent to each other, the third circuit and the fourth circuit are arranged in different columns adjacent to each other, the first circuit and the third circuit are arranged in different rows adjacent to each other, and the second circuit and the fourth circuit are arranged in different rows adjacent to each other.

24. The photoelectric conversion device according to claim 17,
wherein the first circuit group includes a fifth circuit having the same function as the function of the first circuit, and
wherein the third circuit is arranged between the first circuit and the fifth circuit in a top view.

25. The photoelectric conversion device according to claim 17,
wherein the first circuit is a transistor, and
wherein the second circuit is a transistor having the same function as that function of the first circuit.

26. The photoelectric conversion device according to claim 24, wherein a part of the first circuit group is arranged inversely to a part of the third circuit group.

27. The photoelectric conversion device according to claim 17,
wherein the plurality of pixels is formed on a first semiconductor substrate,
wherein the first circuit group and the second circuit group are formed on a second semiconductor substrate, and
wherein a plurality of semiconductor substrates including the first and second semiconductor substrates are stacked.

28. The photoelectric conversion device according to claim 27,
wherein each of the circuits included in the first and second circuit groups includes analog units and digital units, and
wherein a semiconductor substrate provided with the analog units of the circuits and a semiconductor substrate provided with the digital units are different from each other.

29. The photoelectric conversion device according to claim 28, wherein the analog units include a current source or a comparator.

30. The photoelectric conversion device according to claim 28, wherein the digital units include a latch circuit.

31. The photoelectric conversion device according to claim 17, wherein the first circuit group and the second circuit group respectively include a current source of the first signal line and a current source of the second signal line.

32. The photoelectric conversion device according to claim 17, wherein the first and second circuit groups each include a comparator.

33. A photoelectric conversion system comprising:
the photoelectric conversion device according to claim 17; and a signal processing unit configured to generate an image by using a signal output from the photoelectric conversion device.

34. A moving body, comprising:

the photoelectric conversion device according to claim 17; and a control unit configured to control movement of the moving body by using a signal output from the photoelectric conversion device.

* * * * *